United States Patent
Deavenport et al.

(10) Patent No.: US 7,387,815 B2
(45) Date of Patent: Jun. 17, 2008

(54) METALLIZATION OF SUBSTRATE(S) BY A LIQUID/VAPOR DEPOSITION PROCESS

(75) Inventors: Dennis Leon Deavenport, Houston, TX (US); John Lawrence Thornton, Jr., League City, TX (US); Nam Hung Tran, Pasadena, TX (US); Samuel Stewart Newberg, Vernon Hills, IL (US)

(73) Assignee: Akzo Nobel N.V., Arnhem (NL)

( * ) Notice: Subject to any disclaimer, the term of this patent is extended or adjusted under 35 U.S.C. 154(b) by 195 days.

(21) Appl. No.: 10/943,098

(22) Filed: Sep. 16, 2004

(65) Prior Publication Data

US 2005/0064211 A1 Mar. 24, 2005

Related U.S. Application Data

(60) Provisional application No. 60/504,641, filed on Sep. 19, 2003.

(51) Int. Cl.
*C23C 16/12* (2006.01)
*C23C 16/06* (2006.01)

(52) U.S. Cl. ............ 427/250; 427/255.23; 427/543; 427/422; 427/427

(58) Field of Classification Search .......... 427/543, 427/250, 255.23, 422, 427
See application file for complete search history.

(56) References Cited

U.S. PATENT DOCUMENTS

| | | | |
|---|---|---|---|
| 2,599,978 A | 6/1952 | Davis et al. | 252/472 |
| 2,671,739 A | 3/1954 | Lander | 117/106 |
| 2,700,365 A | 1/1955 | Pawlyk | 118/48 |
| 2,824,828 A | 2/1958 | Homer et al. | 204/20 |
| 3,041,197 A | 6/1962 | Berger | 117/47 |
| 3,251,712 A | 5/1966 | Berger | 117/113 |
| 3,449,144 A | 6/1969 | Williams et al. | 117/6 |
| 3,449,150 A | 6/1969 | Williams et al. | 117/50 |
| 3,464,844 A | 9/1969 | Williams | 117/46 |
| 3,578,494 A | 5/1971 | Williams et al. | 117/60 |
| 3,700,477 A | 10/1972 | Yamagishi et al. | 117/17 |
| 3,702,780 A | 11/1972 | Withers | 117/104 R |
| 3,707,136 A | 12/1972 | Kostas | 118/303 |
| 4,430,364 A | 2/1984 | Ito | 427/91 |
| 4,923,717 A | 5/1990 | Gladfelter et al. | 427/252 |
| 4,924,701 A * | 5/1990 | Delatorre | 73/152.52 |
| 4,956,204 A * | 9/1990 | Amazawa et al. | 427/248.1 |
| 5,290,602 A * | 3/1994 | Argyropoulos et al. | 427/422 |
| 5,372,849 A * | 12/1994 | McCormick et al. | 427/253 |
| 5,451,434 A * | 9/1995 | Doellein | 427/255.31 |
| 6,099,903 A * | 8/2000 | Kaloyeros et al. | 427/250 |
| 6,136,725 A | 10/2000 | Loan et al. | 438/758 |
| 6,184,403 B1 * | 2/2001 | Welch et al. | 556/12 |
| 6,402,126 B2 * | 6/2002 | Vaartstra et al. | 261/141 |
| 6,451,375 B1 * | 9/2002 | Cotte et al. | 427/58 |
| 7,217,398 B2 * | 5/2007 | Blackburn et al. | 422/129 |
| 2003/0056728 A1 | 3/2003 | Lindner et al. | 118/726 |
| 2004/0144399 A1 * | 7/2004 | McDermott et al. | 134/1 |

FOREIGN PATENT DOCUMENTS

| | | |
|---|---|---|
| GB | 1025897 | 4/1966 |
| WO | WO 99/53117 | 10/1999 |
| WO | WO 01/29282 A2 | 4/2001 |

OTHER PUBLICATIONS

J.C. Withers et al., "Aluminum Coatings by a Pyrolytic Spray Chemical Vapor Deposition Process", Chem. Vapor Deposition, Int. Conf. 2nd, pp. 393-407 (1970).

International Search Report, No. PCT/US2004/030376, Dec. 22, 2004.

International Preliminary Examination Report for International Application No. PCT/US04/30376 dated Mar. 22, 2007.

* cited by examiner

*Primary Examiner*—B. Chen
(74) *Attorney, Agent, or Firm*—Robert C. Morriss

(57) ABSTRACT

A process for depositing a substantially pure, conformal metal layer on one or more substrates through the decomposition of a metal-containing precursor. During this deposition process, the substrate(s) is maintained at a temperature greater than the decomposition temperature of the precursor while the surrounding atmosphere is maintained at a temperature lower than the decomposition temperature of the precursor. The precursor is dispersed within a transport medium, e.g., a vapor phase. The concentration of the metal-containing precursor(s) in the vapor phase, which also contains liquid therein, can be at a level to provide conditions at or near saturation for the metal precursor(s). In ensuring the aforementioned temperature control between the transport media and substrate, and in maintaining saturation conditions for the transport media, the quality of the deposited metal thin film is markedly improved and the production of by-product metal dust is greatly reduced or substantially eliminated.

47 Claims, 10 Drawing Sheets

METALLIZATION OF SUBSTRATE(S) BY A LIQUID/VAPOR DEPOSITION PROCESS

CROSS REFERENCE TO RELATED APPLICATION

This application claims priority to U.S. Application Ser. No. 60/504,641, filed Sep. 19, 2003.

FIELD OF INVENTION

The field of the invention relates to metallic coatings deposited by Chemical Vapor Deposition ("CVD") and products and processes thereof.

BACKGROUND OF THE INVENTION

Deposited metal films formed by chemical vapor deposition (CVD) methods are common practice for a variety of semiconductor and micro-electronic applications. Attempting to deposit metallic thin films for coatings using CVD methods has proven to be difficult. Difficulties may be particularly pronounced when producing thick films (1 to 2 microns thick or greater), such as protective coatings including corrosion resistant coatings.

Several metal deposition approaches have been published that utilize solid, liquid and gaseous metal precursors that are volatilized and introduced into a reaction chamber, where the precursor is decomposed into its constituent components with the metal moiety being deposited onto a target substrate. Although metallization of a substrate has been achieved, the poor quality of thin film formation has prohibited economically attractive applications of such coatings.

Aluminum metal is a logical choice for thin-film coatings for the corrosion protection of a substrate. Typical methods of applying aluminum coatings have been physical vapor deposition (PVD) methods including ion vapor deposition (IVD). These methods have provided aluminum coatings, but require expensive deposition equipment and are difficult to operate and maintain.

Other methods, such as CVD, have provided aluminum coatings but have been difficult to control with the decomposition of the aluminum precursor throughout the deposition chamber causing aluminum dust in the transport medium and subsequently on the surface of the target substrate. The formation of dust particles proves detrimental to the quality of the thin film on the substrate in terms of corrosion protection, surface morphology, and aesthetics.

A liquid phase plating method where the deposition of aluminum is achieved by convection heating of target metals with the subsequent metal plating employing the use of liquid metal alkyl precursors is described in U.S. Pat. Nos. 3,449,144; 3,449,150; 3,464,844; 3,578,494; and 3,707,136. These approaches have issues with temperature control, deposition layer thickness control, and process design equipment requirements.

U.S. Pat. No. 2,700,365 to P. Pawlyk teaches a gas phase method, rather than one utilizing a liquid-containing vapor, for plating surfaces by using carbonyls or other volatile metal-bearing compounds.

J. C. Withers was granted U.S. Pat. No. 3,702,780 which teaches the use of an atomization spray comprising a metal-containing precursor to coat an inductively heated substrate with a plating film. This patent describes monitoring the temperature of the substrate. This technology, termed the "Pyrolytic Spray Technique", is further described in Chem. Vapor Deposition, Int. Conf., $2^{nd}$ 1970, 393-407.

Previous attempts to transfer aluminum coatings from CVD laboratory apparatus to larger scale equipment for mass production have proven difficult. Coating integrity has been difficult to attain in larger CVD reactors.

SUMMARY OF THE INVENTION

The present invention relates to an improved process for depositing a substantially pure, conformal metal layer on one or more substrates through the decomposition of a metal-containing precursor. During this deposition process, the substrate(s) is maintained at a temperature greater than the decomposition temperature of the precursor while the surrounding atmosphere is maintained at a temperature lower than the decomposition temperature of the precursor. The precursor is dispersed within a transport medium, e.g., a vapor phase. The concentration of the metal-containing precursor(s) in the vapor phase, which also contains liquid therein, can be at a level to provide at or near saturation conditions for the metal precursor(s). In ensuring the aforementioned temperature control between the transport media and substrate, and in maintaining at least near saturation conditions for the transport media, the quality of the deposited metal thin film is markedly improved and the production of by-product metal dust is greatly reduced or substantially eliminated.

An embodiment of the present invention provides more substrate temperature control, better deposition layer thickness control, and more advantageous process equipment designs, as compared to prior known approaches.

A preferred embodiment of the present invention transports a precursor with a transport medium through a transport space to the substrate. The temperature in the transport space is less than the decomposition temperature of the precursor. The metal layer is deposited on the substrate through the precursor decomposing onto the substrate. The temperature of the substrate is greater than the precursor decomposition temperature, and the temperature of the precursor in the transport space is directly measured and controlled. It will be appreciated that the temperature of the substrate is the temperature of those surface portions of the substrate that are intended to come in contact with the precursor for the ultimate deposition of a coating thereon.

Another preferred embodiment deposits aluminum onto a substrate by heating the substrate with an inductive energy source and employing a liquid-containing vapor phase that includes an aluminum-containing precursor to deposit aluminum onto the surface of the substrate. The surface temperature of the substrate is above the decomposition temperature of the aluminum-containing precursor, and the vapor phase is maintained below that decomposition temperature in the transport space.

It is another object of the invention to provide a CVD process that can transfer from a small scale laboratory apparatus to larger scale production equipment by producing a reaction environment which allows for the coating of large quantities of small parts or other substrates.

It is another object of the invention to provide an improved process for depositing metal, e.g., aluminum layers, on various substrates through the decomposition of a metal-containing precursor. While one embodiment involves the use of organoaluminum precursors, the process can use other metal-containing precursors, either singly or in combination, including other organometallic compounds, carbonyls, and acetyl acetonates.

In a preferred embodiment, the source of an aluminum layer, for example, can be a liquid metal alkyl compound, such as trimethylaluminum, dimethylaluminum hydride, triethylaluminum, diethylaluminum hydride, triisobutylaluminum, diisobutylaluminum hydride, or other trialkylaluminum or dialkylaluminum hydride molecule of the formula $R^1R^2R^3Al$, where $R^1$, $R^2$, and $R^3$ are branched, straight chain, or cyclic hydrocarbyl ligands or hydrogen, and where the number of carbon atoms in $R^1$, $R^2$, and $R^3$ range from $C_1$ to about $C_{12}$. The chosen ligands may also include those such as butadienyl or isoprenyl which are bifunctional and which bond to two or three aluminum atoms. The selected liquid/vapor precursor compositions may contain mixtures of any or all of the above-mentioned species. Preferably, $R^1$, $R^2$, and $R^3$ as described above are selected from ethyl, isobutyl, and hydrogen, with the most preferred compounds being triisobutylaluminum, diisobutylaluminum hydride or mixtures of the two.

The transport medium may also contain a dilute solution of the metal alkyl in a variety of non-reactive solvents with a range of boiling points from about 60° C. to over about 200° C. and at aluminum alkyl concentrations ranging from about 5 to about 95 wt %. The benefits of introducing aluminum alkyls in solution are (1) to provide more uniform distribution of the precursor to the surface of the substrate(s), (2) to lower the pyrophoricity of the feed liquid, and (3) to help maintain a proper liquid and vapor heat balance within the reaction zone.

It is another object of the invention to provide a substrate with a deposited metallic coating where the metallic coating is uniform and non-bumpy as a result of controlling the transport media and substrate temperature.

In a preferred embodiment, suitable substrates include (but are not limited to) small assembly parts, such as fasteners, nuts, bolts, screws, nails, rivets, and pins. Other substrates that are suitable for coating include clamps, ferrules, clips, and tags. There is no limitation in the size of the substrates except for those imposed by the equipment at hand. Preferred substrates are three-dimensional objects measuring in the order of centimeters in any or all of their dimensions, with simple and complex geometries.

DETAILED DESCRIPTION OF THE INVENTION

A significant advantage of an embodiment of the present process with respect to non-CVD alternatives is that the process allows for the effective coating of complex shapes with small features and patterns such as openings, crevices, lines, dents, dimples, pits, and indentations due to the nature of the precursor diffusion in the vapor phase.

The ability of the substrate to withstand temperatures at or above the decomposition temperature of the precursor is a function of the composition of the substrate to be coated. Suitable substrates can be made of a variety of materials, including (but not limited to) pure metals, such as iron, copper, and aluminum, metallic alloys and modifications, such as steel, bronze, and the like, and hybrid and composite materials thereof. Other suitable substrates include polymeric materials with a wide range of functionalities such as polytetrafluoroethylene, nylon, polyalkylamides, polyaramides, polyolefins, polyesters, and the like.

In one embodiment, a series of surface-modified substrates can be coated with a desired metal. These include organic, inorganic, and hybrid compositions onto which a surface conversion such as electroless metal deposition, hardening, curing, or any suitable process, imparts the desired ability to withstand surface temperatures equal to or greater than the precursor decomposition temperature.

In a preferred embodiment, the process deposits a metal layer onto a substrate, where the metal layer is formed by a metal-containing precursor composition within a liquid-containing vapor phase, where the temperatures of the substrate and vapor phase are controlled such that the temperature of the liquid-containing vapor phase is maintained below the precursor decomposition temperature in the transport space and the metal substrate is maintained above the precursor decomposition temperature during the duration of the deposition process. The relationship between the temperatures can be represented in the following equation:

$$T_{vapor} < T_{Decomposition} \leq T_{Substrate}$$

where $T_{vapor}$ is the temperature of the vapor in the transport space, where $T_{Decomposition}$ is the precursor decomposition temperature, and where $T_{Substrate}$ is the temperature on the surface of the substrate to be coated.

Figure 3:
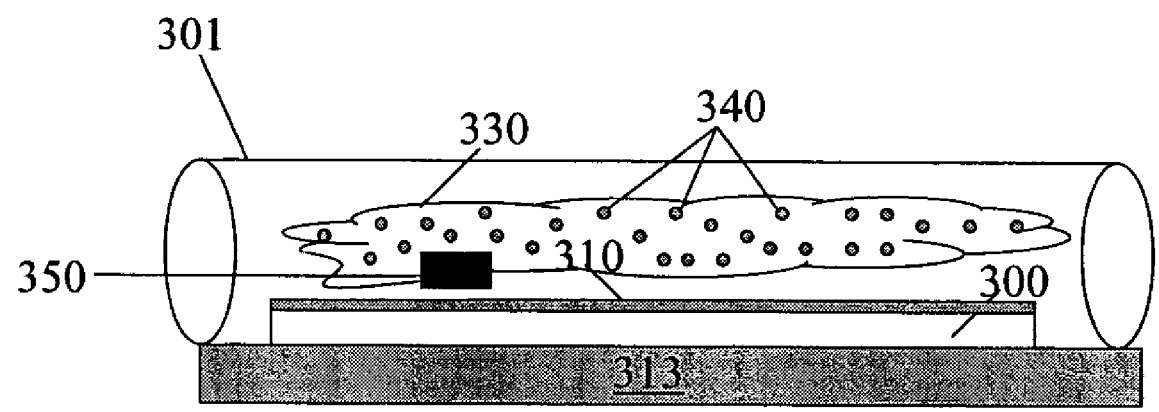
FIG. 3 is a close up view of a coated substrate inside a reaction vessel.

FIG. 3 illustrates a close up view of a coated substrate in a reaction vessel. The transport space (301) may be the space inside a vessel composed of any suitable material, including a substantially transparent material such as PYREX glass so that the reaction may be observed. Substrate (300) is inside of the reaction vessel and deposited metallic film (310) is bonded on surface of the substrate. Any suitable means for heating (313) the substrate may be used to keep the substrate temperature greater than the precursor deposition temperature. Transport medium (330) is shown here, with precursor material (340) at near saturation levels inside the transport medium (330). The temperatures of the transport medium (330) inside the transport space and the substrate (300) may be measured by any suitable means such as a thermocouple (350).

In a preferred embodiment, the temperature of the precursor in the transport space is directly measured. The temperature is measured by a thermocouple, heat sensor or other suitable means directly in the transport space, as opposed to temperature measurement in a precursor supply line. The direct measurement of temperature in the transport space may allow direct and precise control over the temperature of the precursor in transport space, as opposed to imprecise indirect control by constant process parameters such as constant induction voltage or a constant flowrate of precursor. In another preferred embodiment, direct measurement of the temperature of the precursor in the transport space may be controlled with a precision of ±10° C. and more preferably ±5° C. Such precise control over the temperature of the precursor in the transport space may result in a higher quality coating, less waste, and thicker coatings. Without precise temperature control, large temperature variations may ensue. If the temperature becomes too high, the precursor may become unstable, possibly leading to the formation of impurities such as black dust in the coating. If the temperature is too low, then the kinetics of the deposition may be altered in an unfavorable way, possibly leading to undesirable effects such as pooling of liquid.

In a separate preferred embodiment, the metal coating comprises aluminum and the transport medium is a vapor. Optimized temperature ranges vary according to the precursor metal alkyl(s) used as the aluminum source. The temperature range for the substrate(s) can be maintained from about 270° C. to about 400° C. by either induction or microwave energy with the substrate temperature range for triethylaluminum (TEAL) and mixtures of TEAL and diethylaluminum hydride (DEAL-H) being in the range of from about 290° C. to about 360° C. Vapor temperatures for these precursors can vary from about 180° C. to about 280° C. with a preferred range from about 220° C. to about 235° C. For triisobutylaluminum (TIBAL) and diisobutylaluminum hydride (DIBAL-H), the substrate and vapor temperatures will be lower due to the lower decomposition temperature for these precursors. Substrate temperatures for neat TIBAL or DIBAL-H can be as low as about 210° C. and as high as about 350° with a preferred range for this temperature parameter being from about 290° C. to about 330° C. The vapor temperature in the reaction space needs to be controlled from about 180° C. to about 270° C. to ensure high quality layers, with a preferred range ranging from about 185° C. to about 260° C.

Pretreatment of the substrate, particularly if made of metal, with a cleaning agent, for example, a standard soap and water solution, followed, for example, by acetone rinse to dry the substrate, is normally desired. Removal of scale and/or oxide layers from metal substrates, by such means as bead-blasting, is likewise desired. It has also been determined that certain thin chemical coatings added to prevent incidental oxidation prior to coating do not interfere with the formation of high-quality, adherent aluminum layers.

A number of methods for heating the outermost layer of the substrate may be used to effect the decomposition of the precursors. In a preferred embodiment, an indirect "non-contact" heating method is used where the heating of the substrate is induced by electromagnetic induction or irradiation with microwave, UV, or IR energy. In an alternative embodiment, an induction heating method, such as electromagnetic induction, has been found to be an attractive means to heat the substrate by inducing electrical current within the substrate to produce heat.

In a preferred embodiment, during the metallization step, the substrate is surrounded by a suitable transport medium containing the precursor. Preferred transport media include a substantially saturated vapor, a substantially saturated vapor containing liquid droplets, or a non-saturated vapor containing liquid droplets. A particularly preferred transport medium includes a gas/liquid equilibrium phase. Homogeneous and heterogeneous mixtures such as solutions, emulsions, dispersions, and suspensions, as well as colloidal, and micellar phases are also adequate transport media.

Besides the precursors, the transport medium may include delivery vehicles for the precursor such as inert gases, solvents, etc., as well as decomposition products, such as saturated or unsaturated hydrocarbons, hydrogen, and other volatile compounds. Mixed and equilibrium phases may involve any or all of the above mentioned components. In a preferred embodiment transport medium is in a vapor phase containing an inert gas and the precursor is an aluminum-containing precursor coexisting in liquid and gas phases. In an alternative embodiment, the transport medium is in a gas/liquid phase equilibrium. In another alternative embodiment the transport medium is a vapor phase.

In an embodiment where the precursor is a liquid, the precursor can, for example, be introduced by direct injection into the reaction zone and is then subsequently vaporized by the heated parts. If desired, the liquid precursor can be introduced in the form of an atomized spray into the reaction zone and vaporized by the heated parts. Preferably, the liquid precursor is vaporized by heat from the heated substrate while the liquid is still in the transport space. In some embodiments, a saturated vapor of the precursor can be injected into the reaction zone from an external vaporizer, such as a falling film evaporator, a wiped film evaporator, or a heated boiler.

One factor that contributes to forming pure, dense, smooth metal layers is achieving proper temperature control for both the substrate and the transport medium in the transport space. This can be accomplished in several different ways. For example, the substrate can be heated to the desired reaction temperature and an atomized spray of the reactive precursor (e.g., aluminum alkyl) can be introduced directly onto the hot substrate(s). The substrate temperature can be controlled by varying the induction power, and the vapor temperature of the transport medium can be controlled in the transport space by adjusting the flowrate of any inert gas that is used to aspirate the precursor composition. At high gas flow rates, the average residence time for the reactive gases would be low and, consequently, the average temperature of the exit gas would also be low. Additional control of the substrate and transport medium temperatures may be derived from varying the concentration of precursor delivered to the process.

Figure 10:
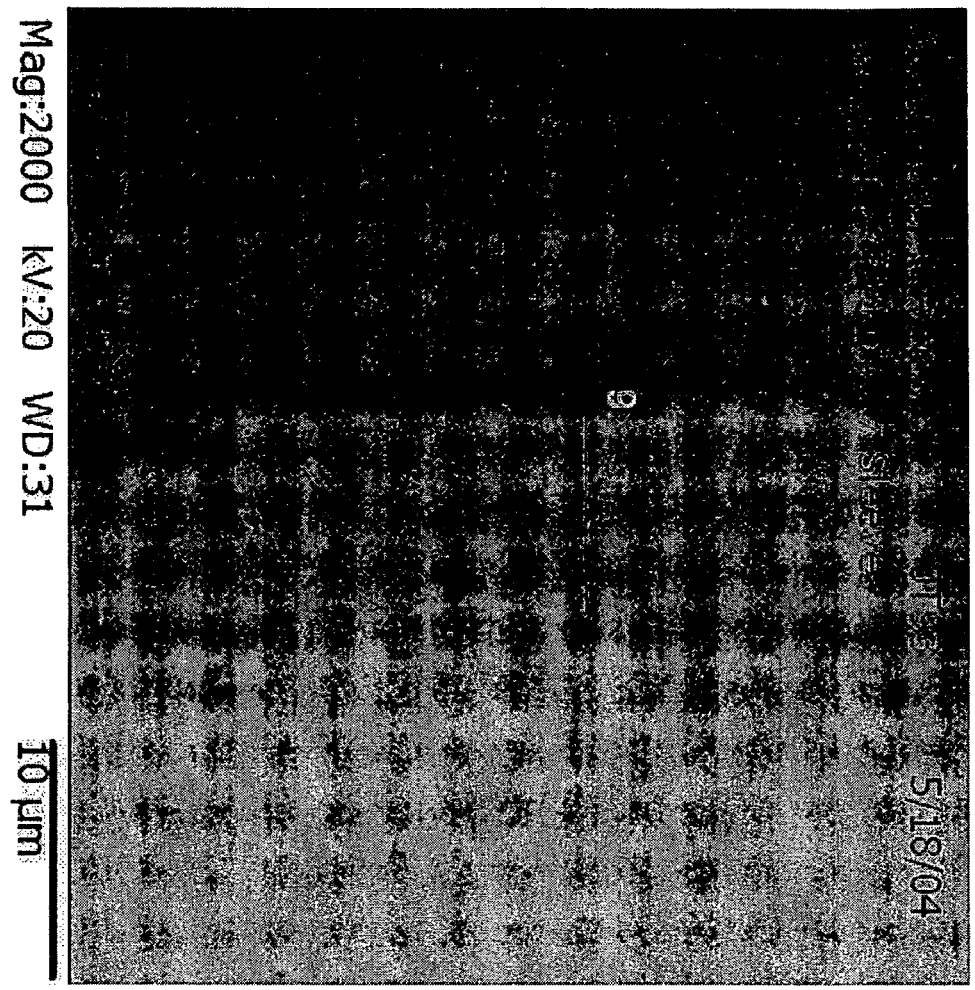
FIG. 10 is a SEM picture of a substrate coated using a CVD process in accordance with a preferred embodiment of the invention.

FIGS. 6-10 show SEM pictures of objects coated with differing processes. FIGS. 6-9 show objects coated with an IVD process. FIG. 10 shows SEM pictures of a preferred embodiment of the invention, and it demonstrates a uniform, relatively pure coating.

Reaction efficiency can be raised or lowered based on the amount of precursor fed to the process. Escaping precursor can be condensed out of the exit gas stream and recycled into the process with no deleterious effect. Higher efficiencies can be expected at lower gas flow rates that would increase the residence time of the hot reactive gases inside the reaction zone. Where the transport medium is a vapor, lowering the gas flow will also have the effect of increasing the vapor temperature, which allows for easy control of the vapor temperature inside the optimum range for the metal-containing precursor. Other means for controlling the vapor temperature in the transport space would be to control the temperature of the inert gas fed into the reaction vessel or by substituting some or all of the carrier gas in a vapor by feeding the metal-containing precursor into the system as a solution in a volatile solvent. Contact between the hot substrate and the precursor solution will generate a rapid evaporation of the solution with the consequential atomization of the precursor. Varying the concentration of the precursor in this solution has the effect of controlling the exit gas temperature. A combination of these methods may also be employed to control vapor temperature in the transport space.

During the process, it has been discovered that it is highly desirable to control process conditions in such a manner as to control the rate of deposition and the quality of the resulting layer. The rate of deposition is primarily dependent on control of substrate temperature whereas layer quality is more a function of transport media temperature and maintenance of saturation conditions of the precursor. In a preferred embodiment, an excess of precursor is maintained inside the reaction zone during active deposition. By dynamically measuring the rate of by-product gas produced from the decomposition reaction, it is possible to calculate the rate of precursor consumption due to decomposition. The rate of precursor injection can therefore be varied such that a known excess of reagent is in the reaction zone at all times. This procedure allows optimum deposition conditions to generate high quality layers at controllable rates of deposition.

Optimal process control to achieve superior results can be derived by modeling the system such that all relevant input variables that are directly controllable are used to calculate a set of output variables known to produce high quality layers at predictable rates of deposition. Input variables to the model include (1) total surface area of the substrate to be coated, (2) target substrate temperature, (3) internal volume of the reaction vessel, (4) rate of inert gas injection into the reactor, (5) initial temperature of the inert gas, and (6) injection rate of the precursor during aspiration. Output variables from the model include (1) rate of deposition, (2) transport medium temperature in the transport space, and (3) the rate at which by-product gas is generated from the decomposition reaction. In one embodiment, substrate temperature is controlled primarily by varying the induction power before and during deposition. Transport medium temperature can be controlled by adjusting the volumetric flow of inert gas used to aspirate the metal alkyl and by varying the temperature of the inert gas. At high gas flow rates, the average residence time for the reactive gases is lower and consequently, the average temperature of the exit gas is low. The average temperature of the exit gas can be further modified by lowering or raising the temperature of the inert gas such that optimal vapor temperature conditions are achieved during deposition. The average temperature of the exit gas is also a function of the total surface area of the heated parts inside the reaction zone. Finally, the rate of injection of precursor into the reaction zone has a major influence on the equilibrium transport medium temperature inside the reactor, with higher transport medium temperatures predicted by the model for higher rates of precursor injection.

In a preferred embodiment, optimal metal deposition quality is generated from transport media that is saturated or is close to saturation with the precursor (e.g., aluminum alkyl). Poorer quality, darker layers are generally observed when the system is more starved in precursor reactant. Visually, this can be seen in the reactor where the deposition takes place. When the walls of the flask are dry, not enough precursor is present in the transport media. Further, the appearance of the growing layer on the substrate may become chalky. The presence of a thin layer of liquid on the walls of the reactor can indicate that there is sufficient precursor in the transport media to achieve saturation or near saturation conditions. While the preferred embodiment operates at saturation conditions, a large excess amount of precursor in the transport media can be deleterious. This condition gives rise to poorer temperature control for the substrates and the transport medium, poorer quality metal layers on the parts, and dark metal dust formation.

The quality of metal layers produced by the instant process may be a complex function of substrate and vapor temperatures, concentration of the precursor in the vapor, and the manner in which the reactant is contacted with the hot substrate. Undesirable non-uniform and bumpy surface can be minimized or eliminated by reducing the size of the droplets contacting the hot surfaces or by introducing a saturated precursor vapor stream over and through the substrate as vapor contacts the substrate. Control of the vapor temperature in the reactor can be maintained by conditioning a circulating vapor stream through a tempered heat exchanger while new liquid is evaporated into the vapor stream to compensate for losses due to deposition or losses in the vent gas.

In a preferred embodiment, the metallization process yields the desired metal layer when the temperature of the transport medium is kept at least one degree centigrade below the decomposition temperature of the precursor. Preferred transport medium temperatures in the reactor are such that decomposition of the precursor does not occur at places other than the surface of the substrate.

In another preferred embodiment, the metal deposition process involves the interaction and control of a number of process parameters. The temperatures of the substrate and of the precursor's environment both need to be monitored and controlled so that the former remains above the latter during the process. Additionally, the degree of saturation of precursor in the transport medium should be sufficiently high and the temperature of the transport medium containing the precursor must be sufficiently low such that the stability point of the transport medium is not exceeded. Exceeding the vapor stability point may cause the precursor to begin to undergo premature decomposition, resulting in dust formation and inferior deposition layer quality.

One of the improved features of the metallization process described in an embodiment of the present invention is the concept of independent control over the temperature of the substrate and the temperature of the transport medium in the transport space. In one embodiment, the temperature of the transport medium in the transport space can be selectively controlled by adjusting the precursor concentration in the transport medium through deliberate dilution in inert gas or other components of the transport medium, adjustment of the delivery rate, or addition of external control agents such as non-reactive liquids or gases.

Precursors escaping the zone of reaction can be condensed and separated from gaseous by-products with the condensed precursor being recycled back into the process to maintain semi-quantitative conversion of the metal in the precursor to metallic metal deposited on the parts. If desired, gaseous byproducts evolved can be vented from the reaction chamber.

The system's vapor pressure can be maintained at pressures approximately equal to, above, or below one atmosphere.

The pressure inside the chamber can be pulsed to improve mass transfer and to also improve the "throwing power" of the aluminum deposition process into holes, channels, grooves, or other zones where vapor access may be restricted.

If desired, the heating power, such as the heating power provided to an induction coil, can be pulsed on and off or otherwise varied to influence the properties of the coating during the deposition process. Similarly, properties such as the thickness of deposited metal can be controlled by varying the temperature of the substrate and the residence time of the substrate inside the deposition zone.

Embodiments of the invention can be utilized for use in batch, semi-batch, continuous, and semi-continuous operation. Variations to the process apparatus and conditions can be applied such that layers of high-quality aluminum and other metals can be plated on powder, small to medium sized parts, wire, tubing, sheet metal, and larger fixtured parts with complex geometries.

Figure 1:
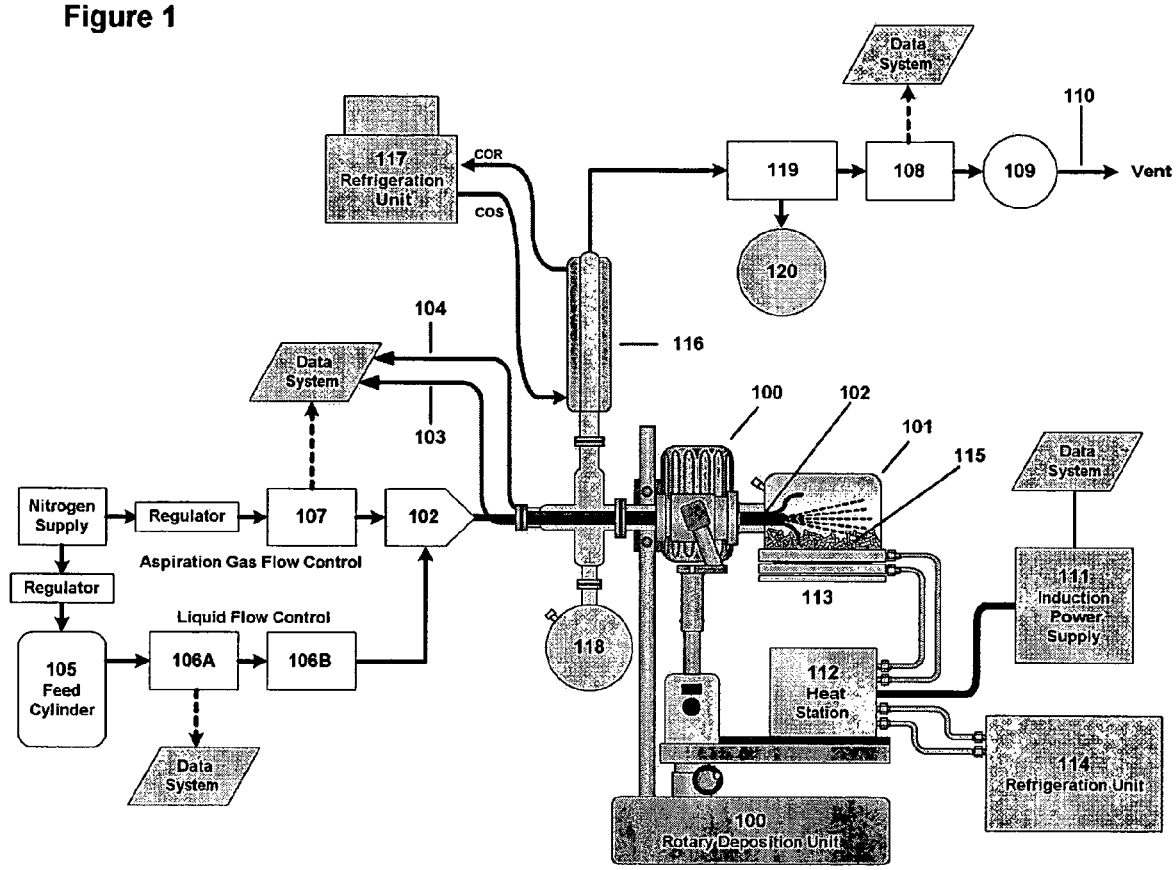
FIG. 1 is an illustration of an exemplary process for depositing a coating onto a substrate.

FIG. 1 depicts a preferred embodiment apparatus for producing a substrate with a thin metal film, e.g., aluminum, being deposited thereon. The primary reactor assembly includes a rotary deposition unit (100), a baffled PYREX glass reaction vessel (101), an atomization probe (102), substrate and transport media temperature measurement probes (103) and (104), a condenser (116) equipped with a refrigeration unit (117), and a condensate receiver (118). Liquid precursor is fed into the reaction vessel from a pressurized feed cylinder (105) through a liquid flow control unit (106A) and (106B) and into the atomization probe (102). Inert aspiration gas is fed from a pressurized supply through gas flow controller (107) to the atomization probe (102). Substrates in the form of small parts (115) introduced into the reaction vessel are heated by an induction field generated by an induction power supply (111), a remote heat station (112), and an induction coil (113) placed immediately below the rotating vessel. Exit gases from the reaction vessel pass through the condenser (116) and into a demister (119). Liquid precursor that coalesces in the demister collects in a receiver (120) for reuse. The rate of gas flow generated in the system is measured by a flowmeter (108) and is totalized in a volumetric gas meter (109) before the gases exit the system through the vent line (110).

Table 1A illustrates the approximate ranges for conditions present in some of the embodiments of the invention. Table 1B illustrates approximate ranges of corrosion performance for various aluminum coating thicknesses as measured by ASTM B-117 standard testing procedure. At the lower end of the "run time" range, denoted in the tables as 0 minutes, runs may be performed in a matter of seconds. It is understood that these described ranges and end results are not limiting and that it may be possible to practice an embodiment outside the ranges given in Table 1A.

TABLE 1A

| Condition | Range |
|---|---|
| Substrate Temperature | 200-370° C. |
| Transport Medium Temperature in the Transport Space | 68-270° C. |
| Run Times | 0-60 minutes |

The Examples that follow illustrate certain non-limiting embodiments of the present invention. Table 2 summarizes the conditions of the following Examples.

EXAMPLE 1

Six hundred and twenty M6 indented hex flange bolts weighing a total of 5055 g and having a total surface area of 7576 $cm^2$ were placed into the baffled 10-liter cylindrical reaction vessel (101) shown in FIG. 1. The bolts had been thoroughly cleaned and dried to remove external oils and had been glass bead blasted to remove scale and oxide. The reaction vessel (101) was fixed to the rotating deposition system (100), and the system was flushed thoroughly with nitrogen to remove residual oxygen through the aspiration probe (102). The reaction system was equipped with thermocouples TC1 (103) for measuring part temperature and TC2 (104) for measuring vapor temperature.

Prior to the start of the run, liquid triisobutylaluminum (TIBAL) from feed cylinder (105) was set up to feed at an initial rate of 19.5 g per minute as an atomized mist into the reaction zone through a calibrated rotometer (106A) and flow controller (106B). Atomization was provided by a coaxial aspiration probe (102) that was fed with 10 liters per minute nitrogen as the carrier gas. Gas flow rates were controlled and monitored by a gas flowmeter (107) and were confirmed by a volumetric gas meter (108) and a second gas flowmeter (109) placed in the vent line (110). Heating of the carbon steel bolts was provided by an induction power supply (111) with remote heat station (112) and a water-cooled copper induction coil (113) placed immediately below the reaction zone for efficient energy transfer. Cooling for the electronics and the induction coil was provided by a recirculating refrigeration unit (114).

Figure 4:
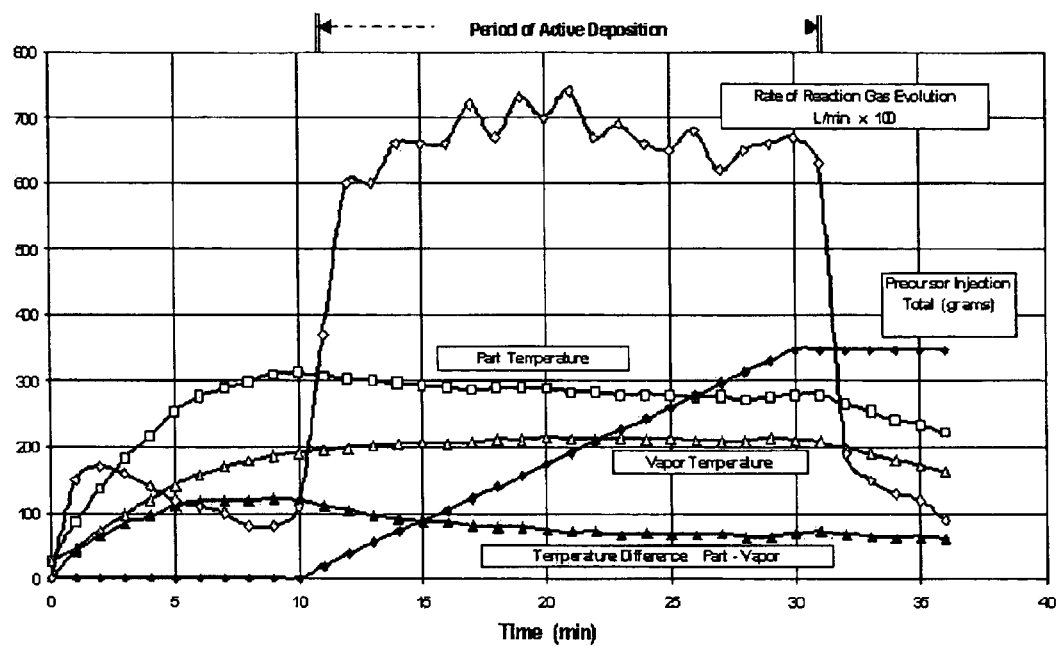
FIG. 4 is a temperature profile of the process constituents during a preferred embodiment of the reaction process.

The entire reaction vessel was rotated at approximately 15 RPM to provide efficient mixing of the parts during deposition. The parts (115) were heated to a temperature of 298-312° C. for four minutes until thermal equilibrium was achieved as shown in FIG. 4. At this point, the reaction was initiated by aspirating liquid TIBAL into the reaction vessel at 19.5 g per minute as a fine mist. Within 30-40 seconds after the mist contacted the hot parts, a light silver uniformly shiny aluminum layer was observed to be coating the parts. Part and vapor temperatures were rigorously maintained in the 272-312° C. and 192-215° C. ranges, respectively, by adjusting the induction voltage on the power supply. FIG. 4 shows that the temperature difference between the vapor temperature in the transport space was maintained throughout the period of active deposition, while the vapor temperature in the transport space was kept below the decomposition temperature of the precursor in the transport space.

Gases and residual aluminum alkyl vapor exhausting out of the reaction zone passed through a glass adapter (116) and a refrigerated cold oil condenser system (117). Residual aluminum alkyl in the vapor was condensed and collected in

TABLE 1B

Typical Corrosion Performance

| | Al° Thickness, μm | | | | | |
|---|---|---|---|---|---|---|
| | 2-4 | 4-6 | 6-9 | 9-12 | 12-16 | 16-25 |
| Hours to Red Corrosion | 25-100 | 100-250 | 250-600 | 600-900 | 900-1200 | 1200 > 2000 | a glass receiver (118). Gases leaving the condenser were then passed through a demister (119) and trap (120) before passing on through a gas flowmeter (109) and a volumetric gas meter (108) and to the vent. Soon after TIBAL was introduced to the chamber, the rate of gas flow through the flowmeter (109) was observed to increase. This may be due in part to the increased production of by-product or "reaction" gas from the decomposition reaction. The differential increase in reaction gas volume was used to monitor the rate of deposition and to determine when to stop the reaction.

The targeted aluminum deposition thickness was 15 µm. The vapor temperature was observed to reach a maximum of 215° C. during the twenty minutes of active deposition. The opalescent silver appearance observed at the onset of deposition was maintained throughout the run. At the point where a pre-determined amount of reaction gas was produced (twenty minutes after start of injection), the TIBAL feed and induction power were turned off and system temperatures were allowed to coast down while maintaining a nitrogen flow of 10 liters per minute. Some additional reaction was observed for two to three minutes past termination of heating.

When the parts cooled below 250° C., no additional reaction was observed. At the point where the temperature of the parts reached 150° C., heptane was introduced to the system through the atomization nozzle. The resulting heptane vapor served to cool the parts and rinse residual aluminum alkyls off the surface of the parts. The parts were rinsed twice with heptane followed by purging with nitrogen to remove residual heptane.

The thickness of aluminum on the parts was calculated to be 15.3 µm (by weight gain). The rate of deposition was computed to be 0.76 µm/min with an overall aluminum utilization efficiency computed to be 66% based on the amount of TIBAL fed during the run. Parts examined under a microscope showed the layers to be uniformly coated with no evidence for layer separation or pin-holes.

EXAMPLE 2

Figure 5:
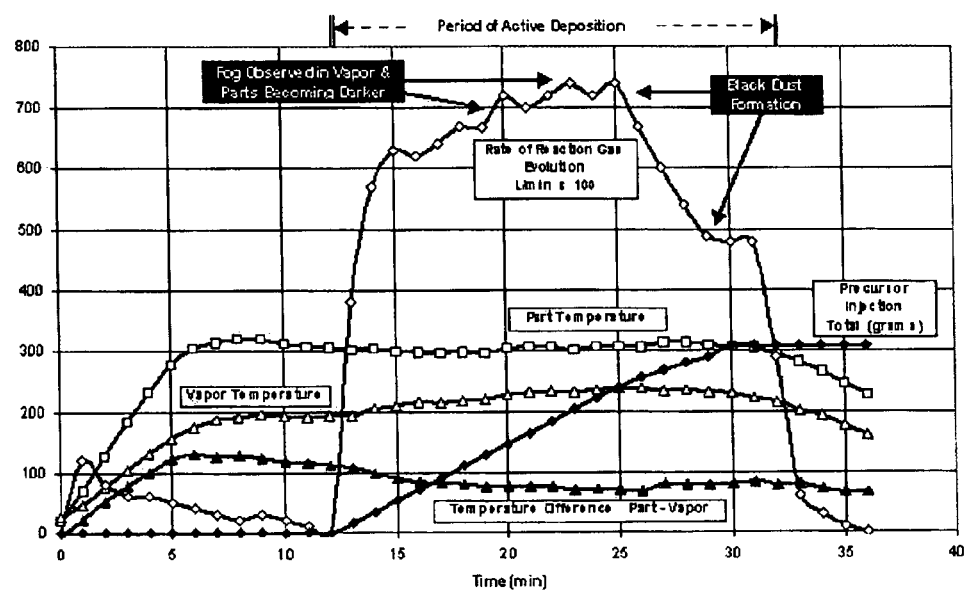
FIG. 5 is a temperature profile of the process constituents during another reaction process.
Figure 6:
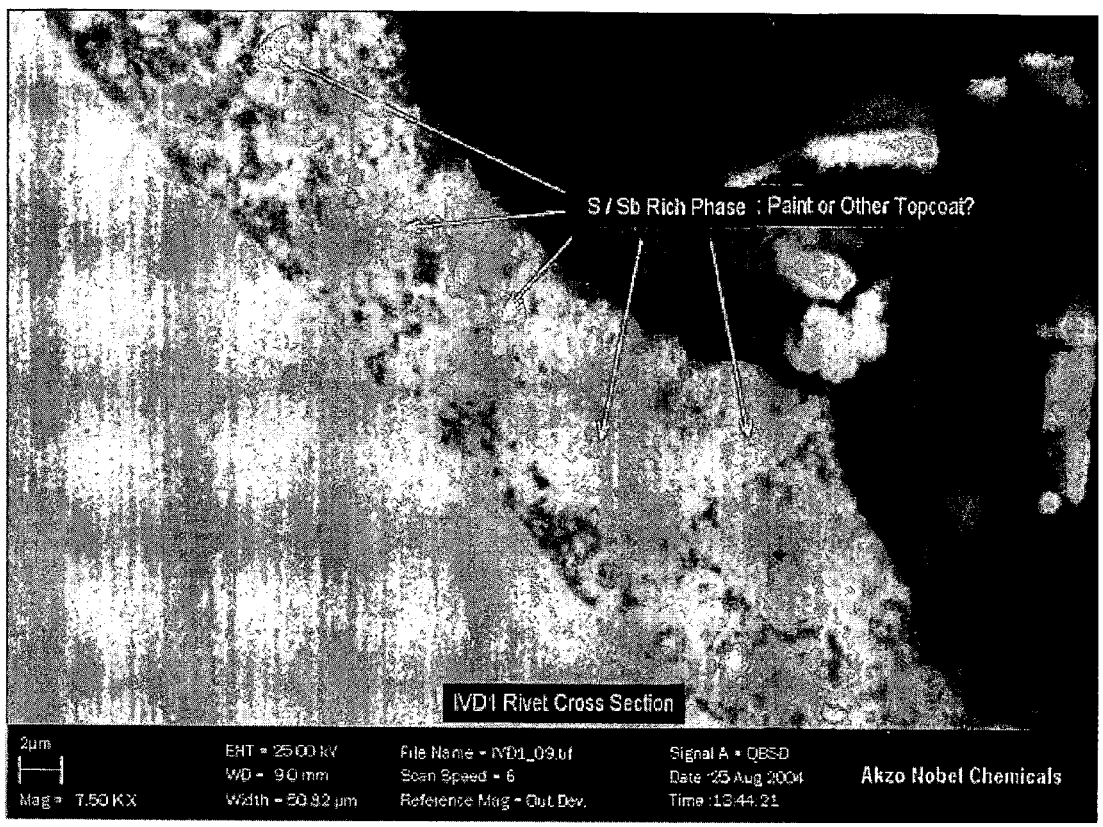
FIG. 6 is a SEM picture of a rivet coated by an IVD process.
Figure 7:
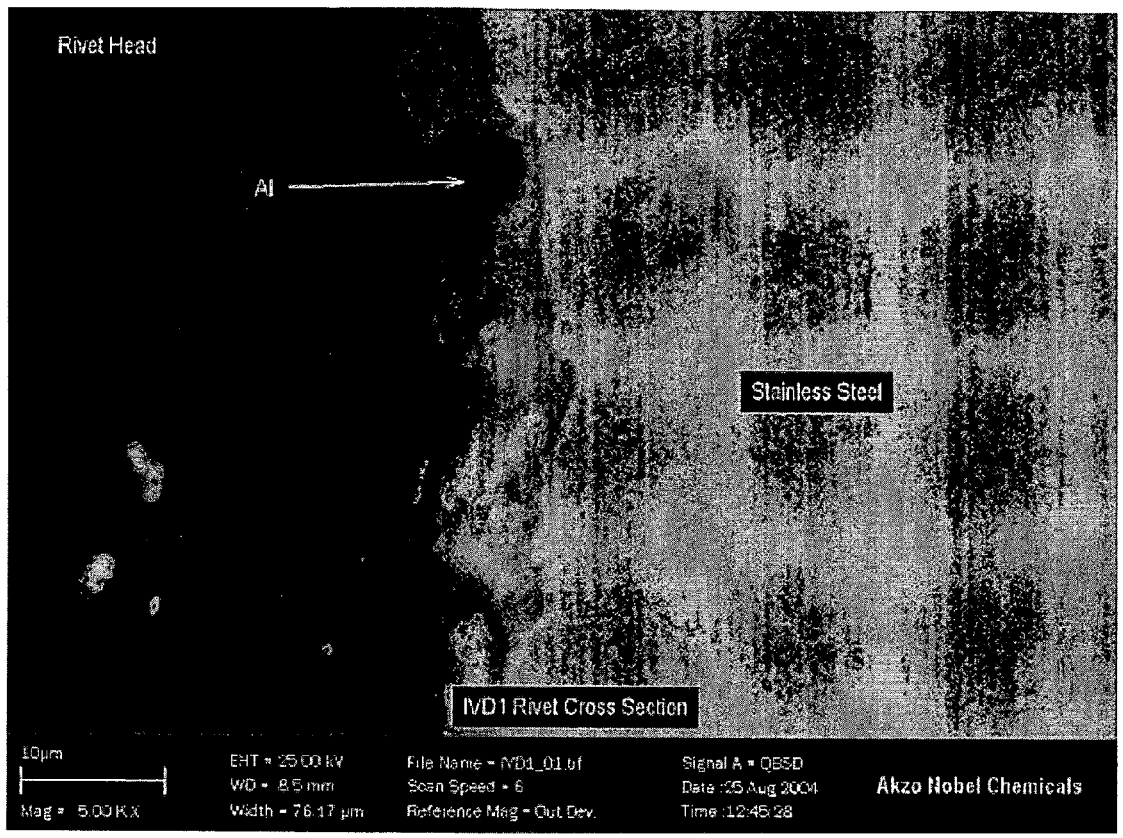
FIG. 7 is a SEM picture of an aluminum coated rivet by an IVD process.
Figure 8:
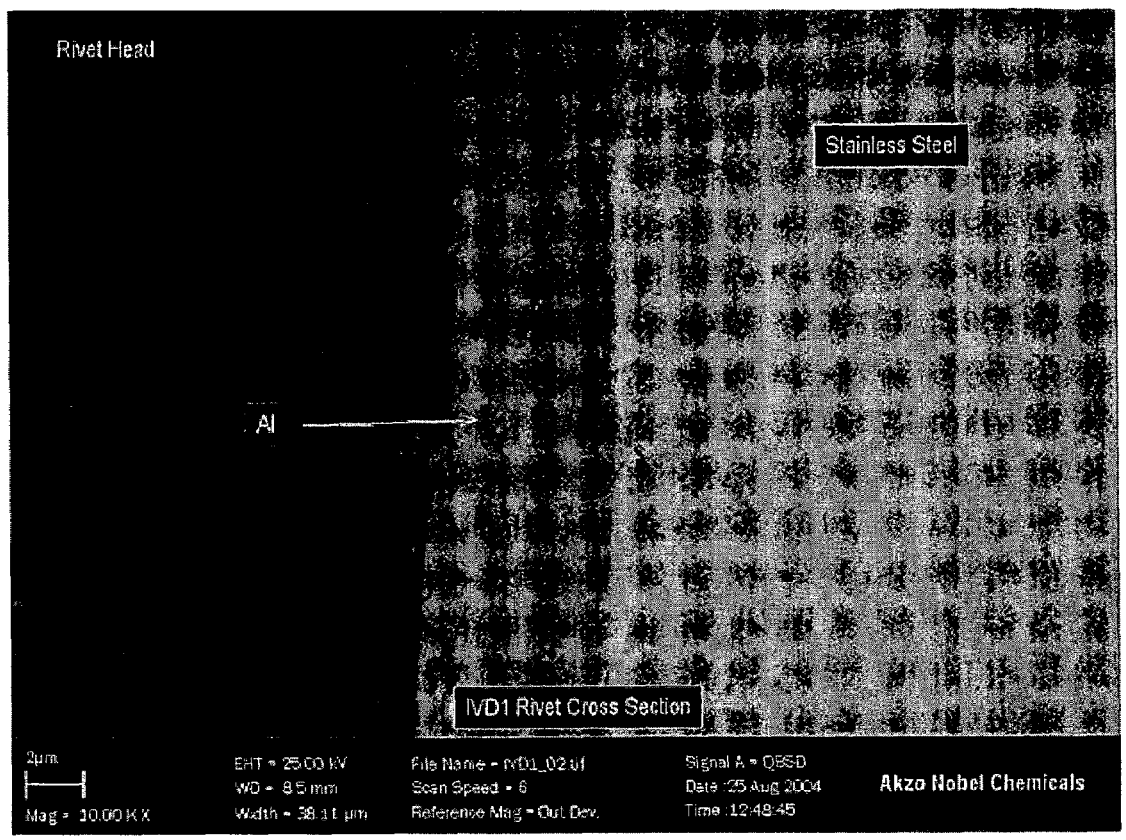
FIG. 8 is a SEM picture of an aluminum coated rivet by another IVD process.
Figure 9:
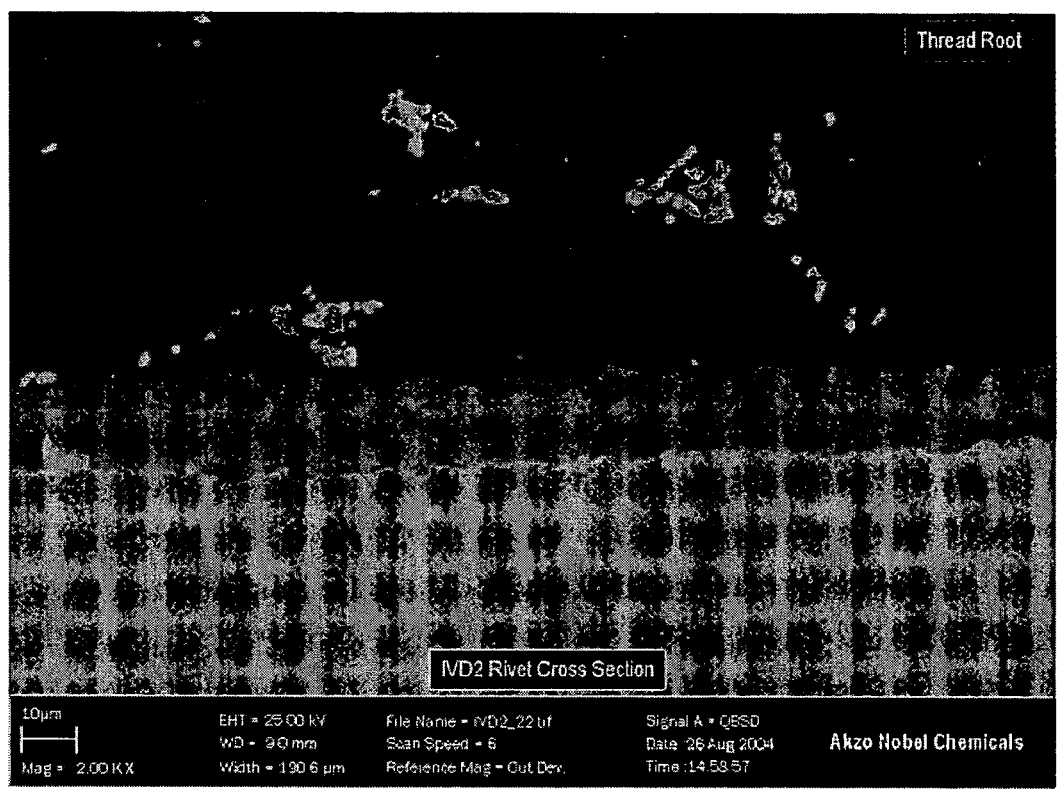
FIG. 9 is a SEM picture of a coated rivet by another IVD process.

Using equipment and procedures similar to those described in Example 1, in this run, the aspiration gas flow was lowered to 5.5 L/min, and the part temperature was allowed to reach a maximum of 315° C. toward the end of the run. No attempt was made to maintain the vapor temperature inside the transport space below the decomposition temperature of the precursor. TIBAL feed was started at 19 g/min for the first thirteen minutes of the run. Within thirty seconds after TIBAL was introduced, all of the parts had taken on a uniform silver appearance. At eight minutes into the run and at a vapor temperature of 232° C., a light gray fog was first observed inside the vessel. The parts began to lose their opalescent silver appearance but no visible dust was observed to be forming on the walls of the reactor, and liquid precursor was still present on the reactor wall. At thirteen minutes into the run, the TIBAL feed rate was lowered to 11.5 g/min. For the next five minutes, the parts became darker, and black aluminum dust was observed to start forming and collecting on the wall of the reactor. Excess precursor liquid began to disappear from the wall of the reactor, and the reaction gas rate dropped off rapidly indicating that the reaction was becoming starved for precursor. At this point, the reaction was terminated as described in Example 1. The aluminum layer examined under a microscope after the run was visibly darker, more porous, and coated with microscopic black dust particles. FIG. 5 illustrates further data from this run.

EXAMPLE 3

Using equipment and procedures similar to those described in Example 1, a run was conducted to determine conditions required to generate high-quality aluminum layers using triethylaluminum (TEAL) as the precursor. As shown in Table 2, 222 parts with a total surface area of 3972 $cm^2$ were heated to a range from 322-366° C. TEAL was delivered at 8-9 g/min by atomization in a stream of nitrogen at 6 L/min. At these conditions, the observed vapor temperature ranged from 247-268° C. The initial aluminum deposition was matte silver, but soon afterwards, black dust was observed to be forming and collecting on the walls and on the parts. Little if any excess TEAL was observed as a liquid film on the wall of the flask. The run was terminated after fourteen minutes. A layer thickness of 8.0 µm was computed by average weight gain with the rate of deposition computed at 0.57 µm/min. When examined under a microscope, the layers were quite dark, porous, and contaminated with black dust. Rubbing the parts with a brass wire brush produced a significant amount of black residue indicative of a brittle, low-quality coating. Exemplar parts placed in a salt fog cabinet under conditions set forth in ASTM B-117 were observed to fail prematurely when compared with other samples coated to a similar thickness from runs producing higher quality layers. Within 50 hours exposure, parts had become severely stained and showed considerable white corrosion on all surfaces. Failure due to red corrosion occurred within 275 hours.

EXAMPLE 4

Using equipment and procedures similar to those described in Example 1, a run was conducted to correct control problems encountered in Example 3 using TEAL as the precursor. During this run, the aspiration gas flow was increased to 10 L/min, and the rate of injection was increased to 10 g/min. Reaction control was directed toward strict control of vapor temperature in the transport space with an upper set point of 230° C. Control of part temperature was secondary and as a result, lower temperatures were observed during the run. The rate of reaction was monitored by measuring the rate that the reaction gas was generated. Under these conditions, high-quality aluminum deposition was achieved. A light silver layer was present during the entire reaction, and no black dust was observed to form. A small amount of liquid was observed on the walls of the reaction vessel. The overall rate of deposition was determined to be 0.39 µm/min at a precursor utilization efficiency of 50%. Parts examined under a microscope showed uniform layer consistency with no pits or breaks in the surface.

EXAMPLE 5

Using equipment and procedures similar to those described in Example 1, a run was conducted using 400 parts with a total surface area of 5084 $cm^2$. The targeted layer thickness was 8 µm. During the first four minutes of the run, TIBAL injection by atomization was maintained at a high rate of 21 g/min. Within 40 seconds after the atomized mist was observed in the chamber, all of the parts had taken on a light, opalescent silver sheen and liquid was observed on the walls of the flask. During the first five minutes of the run, a high rate of reaction was apparent as judged by the rate of reaction gas evolution. Concurrently, the vapor temperature in the transport space was observed to rise from 193° C. to 218° C. At the sixth minute, the TIBAL injection rate was lowered to 10 g/min and maintained at that rate for the remainder of the run. The rate of reaction gas generated decreased significantly, and the vapor temperature began to decrease slowly.

At no time during the run was dust observed to form, and the parts maintained a light silver color. At 11.5 minutes, the run was terminated. The layer thickness was computed to be 7.4 μm in good agreement with the targeted thickness. The final layer quality was judged to be of high quality.

EXAMPLE 6

Using equipment and procedures similar to those described in Example 1, a run was conducted to produce a high-quality aluminum layer with a targeted thickness of approximately 10 μm. A total of 450 parts with a surface area of 4856 $cm^2$ were exposed to atomized TIBAL at a feed rate of 10 g/min while maintaining part and vapor temperatures in the transport space in the ranges of 295-314° C. and 158-198° C. respectively. The reaction proceeded smoothly with the production of a light silver aluminum layer on the parts over the sixteen minute run duration. Parts harvested from the run were of high quality with a computed layer thickness of 11.8 μm. Parts taken from the run were placed in a salt fog cabinet under conditions set forth in ASTM B-117 were observed to resist red corrosion up until 764 hours exposure.

EXAMPLE 7

Using equipment and procedures as similar to those described in Example 1, a run was conducted to produce a high-quality aluminum layer with a targeted thickness of approximately 4 μm. A total of 600 parts with a total surface area of 6474 $cm^2$ were coated at conditions similar to those in Example 6 but at a run time of only six minutes. Parts harvested after run termination were found to have a layer thickness computed at 3.6 μm. Parts taken from the run were placed in a salt fog cabinet under conditions set forth in ASTM B-117 were observed to resist red corrosion up to 68 hours before failure.

EXAMPLE 8

Using equipment and procedures similar to those described in Example 1, a run was conducted to produce a high-quality aluminum layer with a targeted thickness of 8 μm using a load of small parts. A total load of 5000 g of M3 parts with a calculated total surface area of 16,234 $cm^2$ were placed in the reaction vessel for coating. It was deemed that high-quality aluminum layers could be achieved in this run as long as vapor temperatures in the transport space could be maintained below 220° C. at saturated vapor conditions. To accomplish this, lower part temperatures and a lower rate of reaction would be necessary. During the twenty minute run, the rate of layer growth was dynamically monitored by observing the rate of reaction gas production. The primary reaction control was vapor temperature while the part temperature was allowed to establish a lower than normal range starting at 310° C. and ending at 255° C. Using this mode of reaction control, the rate of reaction gas evolution was observed to be relatively constant and the appearance of the parts was uniformly light silver. Parts harvested from the run were analyzed and determined to have achieved the target layer thickness of 8.0 μm.

EXAMPLE 9

Using equipment and procedures similar to those described in Example 1, a run was conducted to produce a high-quality aluminum layer with a targeted thickness of 10 μm. A total load of 3876 g with a surface area of 5985 $cm^2$ were placed in the reaction vessel and coated per normal operating conditions. Parts harvested from the run were found to be of high quality with a calculated layer thickness of 11.5 μm. Parts taken from the run were placed in a salt fog cabinet under conditions set forth in ASTM B-117 were observed to resist red corrosion up 764 hours exposure with only minor white corrosion and no red corrosion.

EXAMPLE 10

Using equipment and procedures similar to those described in Example 1, a run was conducted to produce a high-quality aluminum layer with a targeted thickness of 10 μm using a precursor feed composition of 2 parts by weight TIBAL and 1 part n-heptane. The rate of aspiration gas flow was increased to 15 L/min and the TIBAL/heptane solution was set to inject at a rate of 19 g TIBAL/minute. The run proceeded normally with several exceptions. A high volume of liquid was observed to condense and collect in the receiver (118). The appearance of a smooth, opalescent light silver coating was observed very soon after introduction of the TIBAL/heptane spray.

Part and vapor temperatures were maintained within generally allowed ranges and the run progressed smoothly. Parts harvested from the run were uniformly coated with a smooth, light silver layer of aluminum. The rate of deposition was 1.0 μm/min with a layer thickness calculated at 10.2 μm. Parts taken from the run were placed in a salt fog cabinet under conditions set forth in ASTM B-117 were observed to resist red corrosion up to 600 hours exposure.

EXAMPLE 11

Figure 2:
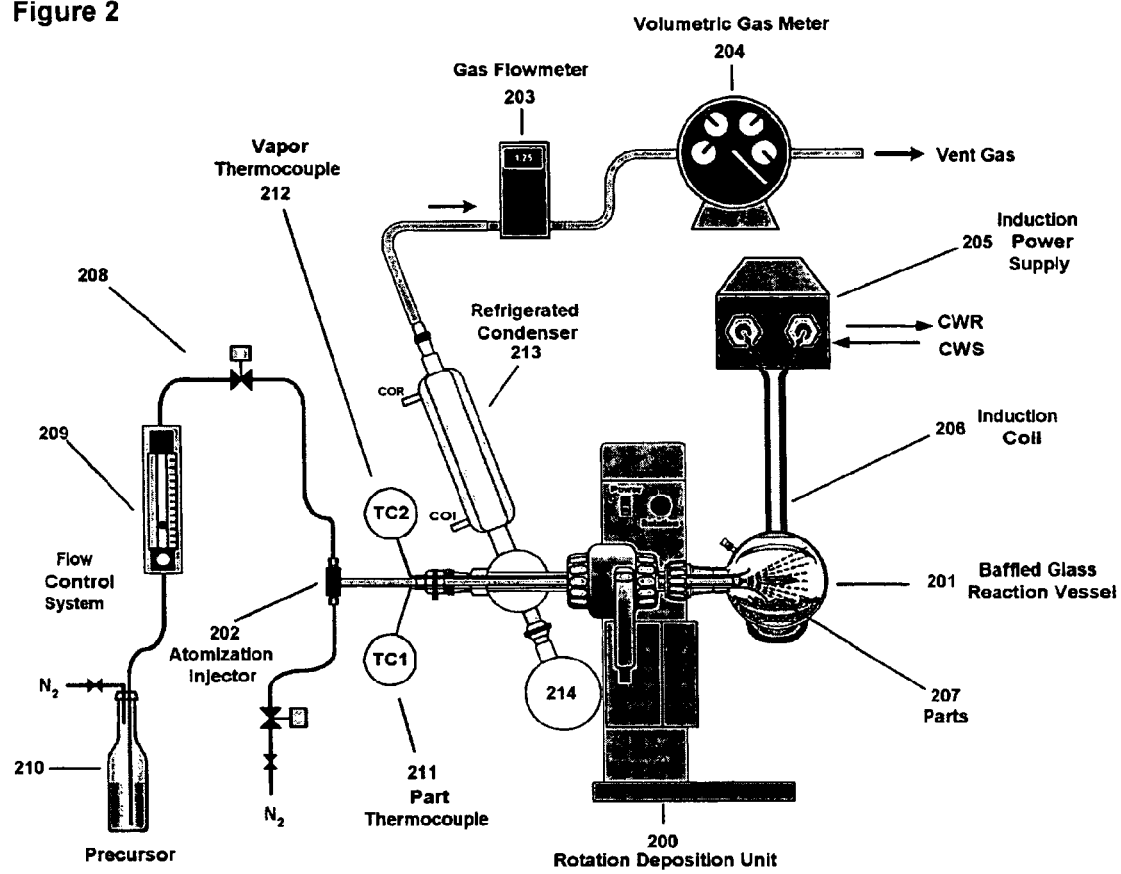
FIG. 2. illustrates another exemplary process for depositing a coating onto substrate.

Using the equipment shown in FIG. 2 and procedures substantially similar to those described in Example 1, a run was conducted using a mixture of tri-n-butylaluminum (TNBAL) and diethylzinc (DEZ) with the intent of producing an aluminum/zinc alloy through co-deposition. A mixture of 44.7 g TNBAL (0.225 moles) and 1.07 g DEZ (0.0087 moles) was prepared for injection by atomization through injection probe (202). A rotary deposition unit (200) equipped with a 2-L baffled glass reaction vessel (201), a refrigerated condenser (213) and receiver (214) was attached to an atmospheric vent in which gases from the unit could pass first through a gas flowmeter (203) and a volumetric gas meter (204). Two thermocouples, TC1 (211) and TC2 (212) were inserted into the reaction vessel to measure the part and vapor temperatures respectively.

Precursor liquid contained in a pressurized bottle (210) was fed into the atomization injector (202) through a liquid flow control system consisting of a rotameter (209) and needle valve (208). Nitrogen used as the atomization gas was fed through a needle valve at a pre-determined rate of 2 L/min as determined by (203) and (204). A total of 106 M6 bolts with a combined weight of 864.4 g and surface area of 1295 $cm^2$ were placed into the reaction vessel. Nitrogen fed through the atomization nozzle served to purge the system of air during the period during which the parts where heated to 326° C. using induction heating from the induction power supply (205) and the induction coil (201). At this temperature, liquid precursor was fed to the reaction vessel as an atomized spray at a rate of 3.1 mL/min. Part temperatures were maintained in a range from 324-338° C. during the run while vapor temperatures in the transport space were observed to range from 139-190° C. Soon after the atomized spray was observed striking the parts, a silver layer was seen to form on the parts. After 17.5 minutes, the run was terminated and the parts were harvested after being thoroughly rinsed with heptane. A total of 4.47 g of aluminum/zinc alloy was found by weight to have been deposited on the parts giving a calculated layer thickness of approximately 12 µm. The appearance of the coating was smooth and lustrous with a slightly bluish-silver color. The aluminum/zinc layer appears to be harder and smoother than similarly coated aluminized parts as determined by physical and microscopic evidence. Overall utilization efficiency was computed to be 73.7% based on 44.0 g of precursor fed during the run and on the weight of aluminum and zinc found on the parts.

EXAMPLE 12

Using the equipment shown in FIG. 2 and procedures substantially similar to those described in Example 11, a run was conducted using di-n-butylzinc (DNBZ) for the purpose of demonstrating deposition of zinc metal on carbon steel parts. A total of 100 M6 parts with a surface area of 1222 $cm^2$ were placed in a 2-L baffled reaction vessel (201). After air had been displaced by sweeping with nitrogen gas, the parts were heated to 203° C. Precursor liquid, DNBZ, was fed into the reaction zone at a pre-determined rate of 1 g/min as an atomized mist. Zinc metal deposition was not observed until a part temperature of about 275° C. and a vapor temperature of 125° C. was reached. Deposition was continued for another 14 minutes with part and vapor temperatures being maintained in the ranges of 262-290° C. and 125-155° C., respectively, at which point the reaction was terminated and the parts were harvested after a thorough heptane rinse. A thin, adherent layer of grayish-silver zinc metal was found to have been plated on the parts.

While the preferred embodiments of the invention have been described above, it is to be understood that this invention is not limited thereto, but may be variously embodied to practice within the scope of the following claims. It will be appreciated that various modifications and alternatives to those details are apparent to one of skill in the art in light of the overall teachings of the disclosure.

TABLE 2

| Example | Precursor | number of parts | batch weight grams | surface area $cm^2$ | $N_2$ flow L/min | parts temp ° C. min-max | vapor temp ° C. min-max | inj rate gram/min min-max | prec. total (g) | run time (min) | thickness Act (Tgt) (µm) | dep'n rate (µm/min) | yield | Appearance |
|---|---|---|---|---|---|---|---|---|---|---|---|---|---|---|
| 1 | TIBAL | 620 | 5055 | 7576 | 10 | 272-312 | 192-215 | 17-19.5 | 347 | 20 | 15.3 (15) | 0.76 | 66% | smooth, silver, no dust |
| 2 | TIBAL | 600 | 4892 | 7332 | 5.5 | 297-315 | 194-238 | 11.5-19 | 309 | 19 | 18.1 (n/a) | 0.95 | 85% | dark, rough, black dust |
| 3 | TEAL | 222 | 2670 | 3972 | 6 | 322-366 | 247-268 | 8-9 | 141 | 14 | 8.0 (n/a) | 0.57 | 36% | dark, rough, black dust |
| 4 | TEAL | 530 | 4323 | 6477 | 10 | 328-342 | 189-225 | 10 | 151 | 15 | 5.8 (n/a) | 0.39 | 50% | smooth, silver, no dust |
| 5 | TIBAL | 400 | 3272 | 5084 | 10 | 276-317 | 193-218 | 10-21 | 162 | 11.5 | 7.4 (8) | 0.65 | 68% | smooth, silver, no dust |
| 6 | TIBAL | 450 | 3940 | 4856 | 10 | 295-314 | 158-198 | 10 | 152 | 16 | 11.8 (10) | 0.74 | 75% | smooth, silver, no dust |
| 7 | TIBAL | 600 | 4590 | 6474 | 10 | 291-317 | 178-185 | 10 | 59 | 6 | 3.6 (4) | 0.61 | 80% | smooth, silver, no dust |
| 8 | TIBAL | 3247 | 5000 | 16,234 | 10 | 255-310 | 193-220 | 15 | 393 | 20 | 8.0 (8) | 0.40 | 66% | smooth, silver, no dust |
| 9 | TIBAL | 580 | 3876 | 5985 | 10 | 286-312 | 189-212 | 12 | 175 | 15 | 11.5 (10) | 0.76 | 78% | smooth, silver, no dust |
| 10 | TIBAL/Hept | 600 | 4570 | 6474 | 15 | 289-311 | 191-226 | 19 | 188 | 10 | 10.2 (10) | 1.00 | 70% | smooth, silver, no dust |
| 11 | TNBAL/DEZ | 106 | 864 | 1295 | 2 | 324-338 | 139-190 | 3.1 (a) | 44 | 17.5 | 9.7 (n/a) | 0.55 | 74% | lustrous, bluish silver |
| 12 | DNBZ | 100 | 815 | 1222 | 2 | 203-290 | 68-155 | 1 | 21 | 24 | 0.9 (n/a) | n/a | 9% | gray-silver |

We claim:

1. A method, comprising:

transporting a metal containing precursor within a transport medium through a chamber containing a transport space to a substrate, wherein the temperature in a the transport space is lower than a decomposition temperature of the metal containing precursor;

depositing a metal layer onto the substrate through the decomposition at the substrate of the metal-containing precursor, wherein the temperature at the substrate is greater than the decomposition temperature of the metal containing precursor;

wherein the temperature of the metal containing precursor in the transport space is directly measured and the temperature of the metal containing precursor in the transport space is controlled using the direct measurement; and the rate of deposition and the quality of said metal layer on said substrate are controlled by control of said substrate temperature, the temperature of the metal containing precursor in the transport space and by maintaining a gas/liquid equilibrium in said transport medium with precursor coexisting in liquid and gas phases thereby maintaining saturation conditions of said precursor in the gas phase of said transport medium.

2. The method according to claim 1, where the transport medium contains a vapor.

3. The method according to claim 1, where the transport medium is an atomized spray.

4. The method according to claim 3,
wherein the transport medium contains an inert gas, and wherein the temperature of the metal containing precursor is controlled by modifying a flow rate of the inert gas in the transport medium.

5. The method according to claim 3,
wherein the temperature of the metal containing precursor is controlled by varying the Quantity concentration of metal-containing precursor in the transport medium.

6. The method according to claim 3,
wherein the transport space contains an inert gas, and wherein the temperature of the metal containing precursor is controlled by modifying a flow rate of the inert gas in the transport space.

7. The method according to claim 1,
wherein the temperature of the substrate is controlled by an induction heating source.

8. The method according to claim 1,
wherein the temperature of the metal containing precursor in the transport medium is controlled by varying the power of the induction heating source.

9. The method according to claim 1,
wherein the transport medium contains an inert gas, and wherein the temperature of the metal containing precursor in the transport medium is controlled by modifying a flow rate of the inert gas in the transport medium.

10. The method according to claim 1,
wherein the temperature of the metal containing precursor in the transport medium is controlled by varying the quantity of metal-containing precursor in the transport medium.

11. The method according to claim 1,
wherein the transport space contains an inert gas, and wherein the temperature of the metal containing precursor in the transport medium is controlled by modifying a flow rate of the inert gas in the transport space.

12. The method according to claim 1,
wherein the temperature of the metal containing precursor is controlled by a combination of variables consisting of varying the power of the induction heating source, varying a flow rate of inert gas in the transport medium, varying a flow rate of inert gas in the transport space, and varying the concentration of the precursor in the transport medium.

13. The method according to claim 1,
wherein the temperature of the metal containing precursor in the transport space is controlled with a precision of ±10° C.

14. The method according to claim 1,
where the metal-containing precursor comprises an organoaluminum compound.

15. The method according to claim 14, wherein said organoaluminum compound is an aluminum alkyl compound having the general formula $R^1R^2R^3Al$,
wherein $R^1$, $R^2$ and $R^3$ are independently H or a branched, straight chain or cyclic hydrocarbyl ligand having a chain length from C1 to C12.

16. The method according to claim 15, wherein $R^1$, $R^2$ and $R^3$ are independently selected from the group consisting of H, an ethyl ligand and an isobutyl ligand.

17. The method according to claim 16, wherein said organoaluminum compound is a compound selected from the group consisting of trimethylaluminum, dimethyl aluminum hydride, triethylaluminum, diethylaluminim hydride, triisobutylaluminum, diisobutylaluminum hydride and mixtures thereof.

18. The method according to claim 17, wherein said precursor is a compound selected from the group consisting of triisobutylaluminum, diisobutylaluminum hydride and mixtures thereof.

19. The method according to claim 15, wherein $R^1$, $R^2$ and $R^3$ are independently selected from the group consisting of H and a ligand selected from the group consisting of butadienyl and isoprenyl, which are bifunctional and which are capable of bonding to two or three aluminum atoms.

20. The method according to claim 1,
where the substrate comprises a metal substrate, where the substrate is heated by induction, and where the metal-containing precursor comprises an organoaluminum compound.

21. The method according to claim 1,
where the substrate contains a metal.

22. The method according to claim 1 further comprising:
measuring an amount of reaction gas;
stopping the metal-containing precursor from entering the transport space after a predetermined amount of reaction gas has been measured.

23. The method according to claim 1 further comprising:
measuring the amount of time the metal layer is deposited on the substrate, where the metal layer is deposited for at least one minute;
stopping the metal-containing precursor from entering the transport space after a predetermined amount of time;
cooling the substrate after stopping the metal-containing precursor.

24. The method according to claim 1 further comprising:
determining a period of active deposition;
measuring a temperature difference between the substrate and the transport medium in the transport space;
maintaining a temperature difference during the period of active deposition.

25. The method according to claim 24,
where the temperature difference is at least one degree.

26. The method according to claim 1, further comprising maintaining a portion of said precursor in said transport space in liquid form.

27. The method according to claim 1, wherein said precursor is introduced into said chamber in liquid form.

28. The method according to claim 1, wherein said transport medium comprises a combination of at least two different metal-containing precursors.

29. The method according to claim 28, wherein the depositing step comprises co-depositing an aluminum/zinc alloy layer onto the substrate through the decomposition at the substrate of a mixture of aluminum-containing and zinc-containing precursors.

30. A method for the deposition of an aluminum layer onto a substrate comprising:
heating a substrate with an inductive energy source;
transporting an aluminum-containing precursor in a liquid containing vapor to a transport space;
depositing an aluminum layer on the surface of the substrate;
measuring the temperature in the transport space;
controlling the temperature of the substrate such that the temperature of the substrate is above the aluminum containing precursor decomposition temperature;
controlling the temperature of the liquid-containing vapor such that the temperature of the liquid-containing vapor is maintained below the decomposition temperature of the precursor in the transport space;
wherein the rate of deposition and the quality of said aluminum layer on said substrate are controlled by control of said substrate temperature, the temperature of the aluminum-containing precursor in the transport space and by maintaining a gas/liquid equilibrium in said transport medium with precursor coexisting in liquid and gas phases thereby maintaining saturation conditions of said precursor in the gas phase of said transport medium.

31. The method according to claim 30,
where the substrate comprises metal.

32. The method according to claim 30,
where controlling the temperature of the substrate is achieved by varying the power of the inductive energy source.

33. The method according to claim 30,
where the aluminum-containing precursor is in the form of an atomized spray.

34. The method according to claim 30,
where controlling the temperature of the substrate is performed by an induction heating source.

35. The method according to claim 30,
where controlling the temperature of the vapor is achieved by varying the power of an induction heating source.

36. The method according to claim 30,
where the vapor phase contains an inert gas, and where controlling the temperature of the vapor is achieved by modifying a flow rate of the inert gas in the vapor.

37. The method according to claim 30,
where the transport space contains an inert gas, and where controlling the temperature of the transport medium is achieved by modifying a flow rate of the inert gas in the transport space.

38. The method according to claim 30,
where controlling the temperature of the vapor phase includes varying the quantity concentration of aluminum containing precursor in the vapor.

39. The method according to claim 30,
where the transport space and transport medium each contain an inert gas and where controlling the temperature of the vapor phase is achieved by a combination of variables consisting of varying the power of an induction heating source, varying a flow rate of inert gas in the transport medium, varying a flow rate of inert gas in the transport space, and varying the quantity of the precursor in the transport medium.

40. The method according to claim 30,
wherein the temperature of the metal containing precursor in the transport space is controlled within 10°0 C.

41. The method according to claim 30 further comprising:
measuring an amount of reaction gas;
stopping the aluminum containing precursor from entering the transport space after a predetermined amount of reaction gas has been accumulated.

42. The method according to claim 30 further comprising:
measuring the amount of time the aluminum layer is deposited on the metal layer, where the metal layer is deposited for at least one minute;
stopping the aluminum containing precursor from entering the transport space after a predetermined amount of time;
cooling the substrate after stopping the aluminum containing precursor.

43. The method according to claim 30 further comprising:
determining a period of active deposition;
measuring a temperature difference between the substrate and the transport medium in the transport space;
maintaining a temperature difference during the period of active deposition.

44. The method according to claim 43,
where the temperature difference is at least one degree.

45. The method according to claim 30, further comprising maintaining a portion of said precursor in said transport space in liquid form.

46. The method according to claim 30, wherein the aluminum-containing precursor is a compound selected from the group consisting of trimethylaluminum, dimethyl aluminum hydride, triethylaluminum, diethylaluminim hydride, triisobutylaluminum, diisobutylaluminum hydride and mixtures thereof.

47. The method according to claim 46, wherein said precursor is a compound selected from the group consisting of triisobutylaluminum, diisobutylaluminum hydride and mixtures thereof.

* * * * *

UNITED STATES PATENT AND TRADEMARK OFFICE
CERTIFICATE OF CORRECTION

PATENT NO. : 7,387,815 B2
APPLICATION NO. : 10/943098
DATED : June 17, 2008
INVENTOR(S) : D. Deavenport et al.

It is certified that error appears in the above-identified patent and that said Letters Patent is hereby corrected as shown below:

Claim 1, column 16, line 41

"temperature in a the"           should read
--temperature in the--            (delete the "a")

Claim 5, column 17, line 8

"the Quantity concentration of"  should read
--the quantity of--               (the "Q" should be in the lower case and the word "concentration" should be deleted)

Claim 38, column 19, line 34

"the quantity concentration of"  should read
--the quantity of--               (the word "concentration" should be deleted)

Claim 40, column 20, line 5

"within 10°0 C."                  should read
--within 10°C.--                  (delete the "0")

Signed and Sealed this

Ninth Day of December, 2008

JON W. DUDAS
*Director of the United States Patent and Trademark Office*